(12) United States Patent
Utsumi

(10) Patent No.: US 11,013,159 B2
(45) Date of Patent: May 18, 2021

(54) ROTARY HEAD AND CONTROL OF A SURFACE MOUNTER

(71) Applicant: Yamaha Hatsudoki Kabushiki Kaisha, Iwata (JP)

(72) Inventor: Tomoyoshi Utsumi, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 491 days.

(21) Appl. No.: 15/774,968

(22) PCT Filed: Nov. 13, 2015

(86) PCT No.: PCT/JP2015/081962
§ 371 (c)(1),
(2) Date: May 9, 2018

(87) PCT Pub. No.: WO2017/081809
PCT Pub. Date: May 18, 2017

(65) Prior Publication Data
US 2018/0376632 A1 Dec. 27, 2018

(51) Int. Cl.
*H05K 13/04* (2006.01)
*H05K 13/02* (2006.01)

(52) U.S. Cl.
CPC ......... *H05K 13/0409* (2018.08); *H05K 13/02* (2013.01); *H05K 13/04* (2013.01)

(58) Field of Classification Search
CPC ..... H05K 13/0409; H05K 13/02; H05K 13/04
See application file for complete search history.

(56) References Cited

U.S. PATENT DOCUMENTS 6,000,523 A * 12/1999 Asai ................. H05K 13/041
198/377.08
6,131,276 A 10/2000 Hirotani et al.
(Continued)

FOREIGN PATENT DOCUMENTS

CN 1196164 A 10/1998
CN 102781213 A 11/2012
(Continued)

OTHER PUBLICATIONS

An Office Action mailed by the State Intellectual Property Office of People's Republic of China dated Sep. 23, 2019, which corresponds to Chinese Patent Application No. 201580084484.5 and is related to U.S. Appl. No. 15/774,968.
(Continued)

Primary Examiner — Minh N Trinh
(74) Attorney, Agent, or Firm — Studebaker & Brackett PC

(57) ABSTRACT

A component mounting device mounts electronic components fed at component feeding positions arranged in one line onto printed circuit boards, and includes a rotary head and a head transfer mechanism. The rotary head includes a rotary body, an N-axis servomotor that rotates the rotary body, pickup nozzles attached to the rotary body in a movable manner along a rotation axis, and two Z-axis drive units. The pickup nozzles are arranged on an imaginary circle centered at the rotation axis, and hold and release the electronic components. The Z-axis drive units move one of the pickup nozzles located at a predetermined driving position on the imaginary circle along the rotation axis. The N-axis drive units are arranged with the rotary body therebetween in a direction in which the component feeding positions are arranged. The head transfer mechanism moves
(Continued)

the rotary head in a direction perpendicular to the rotation axis.

10 Claims, 9 Drawing Sheets

(56) References Cited

U.S. PATENT DOCUMENTS

| | | | | |
|---|---|---|---|---|
| 6,842,974 | B1* | 1/2005 | Maenishi | H05K 13/0478 |
| | | | | 29/832 |
| 10,462,947 | B2* | 10/2019 | Ito | H05K 13/0413 |
| 10,874,040 | B2* | 12/2020 | Tsuri | H05K 13/041 |
| 2006/0112545 | A1* | 6/2006 | Hwang | H05K 13/0411 |
| | | | | 29/834 |
| 2006/0196046 | A1 | 9/2006 | Ricketson | |
| 2017/0325371 | A1* | 11/2017 | Oyama | H05K 13/041 |

FOREIGN PATENT DOCUMENTS

| | | |
|---|---|---|
| JP | 2008-053750 A | 3/2008 |
| JP | 2009-170830 A | 7/2009 |
| JP | 2010-525592 A | 7/2010 |
| JP | 2011-035080 A | 2/2011 |
| JP | 2013-149639 A | 8/2013 |
| WO | 2013/190608 A1 | 12/2013 |
| WO | 2015/063934 A1 | 5/2015 |

OTHER PUBLICATIONS

An Office Action; "Notification of Reasons for Refusal," issued by the Japanese Patent Office dated Feb. 28, 2019, which corresponds to Japanese Patent Application No. 2017-549952 and is related to U.S. Appl. No. 15/774,968; with English Translation.
International Search Report issued in PCT/JP2015/081962; dated Feb. 9, 2016.

* cited by examiner

ROTARY HEAD AND CONTROL OF A SURFACE MOUNTER

This application is a National Stage of International Patent Application No. PCT/JP2015/081962, filed Nov. 13, 2015, the entire content of which is incorporated herein by reference.

BACKGROUND

Technical Field

The technology disclosed herein relates to a component mounting device, a method of mounting components, and a surface mounter.

Background Art

One type of a known component mounting device, which is configured to hold a component by suction and place the component on a board, includes a plurality of pickup nozzles arranged on an imaginary circle and configured to hold and release components and a drive unit configured to move the pickup nozzles in the up-down direction as described, for example, in Japanese Patent Application Publication No. 2008-53750.

More specifically described, in an electronic component mounting device disclosed in Japanese Patent Application Publication No. 2008-53750, multiple vertical shafts extend through a head portion, and nozzles configured to hold electronic components by vacuum are provided at lower ends of the respective shafts. The nozzles are arranged in a circle in a plan view. Cylinders (corresponding to drive units) are disposed directly above the shafts to move up and down the shafts and the nozzles when activated.

SUMMARY

In the above-described electronic component mounting device described in Japanese Patent Application Publication No. 2008-53750, the head portion is not rotated. The cylinders are disposed for the respective shafts (or the respective nozzles). If the component mounting device includes two drive units configured to move the nozzles up and down and the head, which retains the pickup nozzles, is rotated such that the pickup nozzles is sequentially driven by the two drive units, the number of drive units is reduced. This simplifies the structure of the component mounting device. However, the employment of two drive units requires improvement in the arrangement thereof to reduce time required to mount components and to enlarge a feeding area and a mounting area of components.

This specification discloses a technology to reduce the time required to mount components and enlarge the feeding area and the mounting area of components in the component mounting device including two holding member drive units. In addition, this specification discloses a technology to reduce the time required to mount components in a method of mounting components using the component mounting device including the two holding member drive units.

A component mounting device disclosed herein is a component mounting device configured to mount components fed at a plurality of component feeding positions arranged in one line onto boards. The component mounting device includes a rotary head and a head transfer mechanism. The rotary head includes a rotary body, a rotary body drive portion configured to rotate the rotary body, component holding members attached to the rotary body in a movable manner in a direction along a rotation axis, and two holding member drive units configured to move the component holding members located at predetermined driving positions on the imaginary circle in the direction along the rotation axis. The component holding members are arranged on an imaginary circle centered at the rotation axis and configured to hold and release components. The holding member drive units are arranged with the rotary body therebetween in an arrangement direction in which the component feeding positions are arranged. The head transfer mechanism is configured to move the rotary head in a direction perpendicular to the rotation axis.

In the component mounting device, since the holding member drive units are arranged in the arrangement direction of the component feeding positions, the holding member drive units are able to concurrently pick up the components. This configuration requires less time for holding the components, leadings to a reduction in time required to mount components.

In the component mounting device, the holding member drive units are arranged with the rotary body therebetween in the arrangement direction. Compared with the case where the two holding member drive units are located between ends of the rotary body in the arrangement direction, the above-described configuration expands the feeding area and the mounting area of the components in the arrangement direction without changing the range of movement of the rotary head.

Thus, according to the component mounting device, in the component mounting device including holding member drive units, the time required to mount components is reduced, and the feeding area and the mounting area of the components are expanded.

A method of mounting components disclosed herein is a method of mounting components using the component mounting device. The component mounting device is configured to concurrently rotate the rotary body using the rotary body drive portion and transfer the rotary head using the head transfer mechanism. The method includes determining rotary transfer times required for moving the component holding members by which any of the components to be held next to the driving positions of the holding member drive units through rotation of the rotary body; determining transfer times required for moving the driving positions of the holding member drive units to the component feeding positions at which the component to be held next are fed through transfer of the rotary head; determining either the rotary transfer times or the transfer times whichever are longer as transfer times of the holding member drive unit; and holding a component by one of the holding member drive units having the transfer time shorter than the transfer time of the other one of the holding member drive units.

In the above-described method of mounting components, since one of the holding member drive units that has the transfer time shorter than the other is used to hold the component fed at the component feeding position using the component holding member, the time required to mount components is further reduced.

A method of mounting components disclosed herein is a method of mounting components using the component mounting device. In the component mounting device, one side of the arrangement direction in which the component feeding positions are arranged is defined as a left side and the other side thereof is defined as a right side, relative to the rotary head. The method includes holding any of the components fed at any of the component feeding positons more to the left side relative to the holding member drive unit on the right side by one of the holding member drive units on the left side when the rotary head is moved to a left end of a movable range; and holding any of the components fed at any of the component feeding positions more to the right side relative to the holding member drive unit on the left side by one of the holding member drive units on the right side when the rotary head is moved to a right end of the moving range.

According to the above-described method of mounting components, calculation of the transfer time is not required for the components to be fed at the above-described component feeding positions on the left side and for the components to be fed at the above-described component feeding positions on the right side. Therefore, the time for calculation required for setting the holding member drive unit used for holding the components can be reduced.

A method of mounting components disclosed herein is a method of mounting components using the component mounting device. The method includes holding one of the components using one of the holding member drive units; starting downward movement of one of the component holding members by another one of the holding member drive units before start of the transfer of the rotary head if the one of the component holding members by which the other one of the components to be held next is located at the driving position of the other one of the holding member drive units and the driving position of the other one of the holding member drive units is not located at the one of the component feeding positions at which the component to be held next is fed.

According to the above-described method of mounting components, the component holding member at the driving position of the other one of the holding member drive units is able to hold the component sooner. Therefore, the time required for mounting the component can be reduced.

A method of mounting components disclosed herein is a method of mounting components using the component mounting device. The method includes defining one of the holding member drive units as a main unit and the other one of the holding member drive units as a sub-unit; holding the component by the sub-unit if one of the component feeding positions at which the component to be held next is fed is in a predetermined area including the driving position of the sub-unit; and holding the component to be held by the main unit if the one of the component feeding positions is not in a predetermined area.

The above-described method of mounting components only requires the calculation for determination whether the component feeding position at which the component to be held next is fed is in the predetermined area or not. The method does not require the calculation of the transfer time for each of the holding member drive units. Therefore, the time for the calculation required for setting the holding member drive unit used for holding the component can be reduced.

A method of mounting components disclosed herein is a method of mounting components using the component mounting device. The component mounting device is configured to concurrently rotate the rotary body using the rotary body drive portion and transfer the rotary head using the head transfer mechanism. The method includes: determining rotary transfer times required for moving the component holding members holding the components to be mounted next to the driving positions of the holding member drive units of the holding member drive units through rotation of the rotary body; determining transfer times required for moving the driving positions of the holding member drive units to mounting positions of the components; determining either the rotary transfer times or the transfer times whichever are longer as transfer times of the holding member drive units; and mounting the components using any one of the holding member driving units having the transfer time shorter than the transfer time of the other one of the holding member drive units.

According to the above-described method of mounting components, one of the holding member drive units that has the transfer time shorter than the other is used to mount the component, the time required to mount components can be further reduced.

A method of mounting components disclosed herein is a method of mounting components using the component mounting device. The method includes holding one of the components using one of the holding member drive units; and starting downward movement of one of the component holding members by the other one of the holding member drive units before start of transfer of the rotary head if the one of the component holding members at the driving position of the other one of the holding member drive units is holding one of the component to be mounted next.

According to the above-described method of mounting components, the component holding member at the driving position of the other one of the holding member drive units is able to place the component sooner. Therefore, the time required for mounting the component can be reduced.

Furthermore, a method of mounting components disclosed herein is a method of mounting components using the component mounting. The method includes defining one of the holding member drive units as a main unit and the other one of the holding member drive units as a sub-unit; mounting one of the components using the sub-unit if a mounting position of the one of the components held by one of the component holding members at the driving position of the component holding members at the driving position of the sub-unit is in a predetermined area including the driving position of the sub unit; and mounting the one of the components using the main unit if the mounting positon is not in the predetermined area.

The above-described method of mounting components only requires the calculation for determination whether the mounting position where the next component is to be placed is in the predetermined area having the driving position of the sub-unit therein or not. The method does not require the calculation of the transfer time for each of the holding member drive units. Therefore, the time for the calculation required for setting the holding member drive unit used for mounting of the component can be reduced.

The predetermined area may be a circular area centered at the driving position of the sub-unit or a rectangular area including the driving position.

Compared with the case where the predetermined area has a complicated shape, the above-described method makes it easier to determine whether the component feeding position or the mounting position is in the predetermined area including the driving position of the sub-unit therein or not. This reduces the time for the calculation required in setting of the holding member drive unit used for holding or mounting of the component.

The component mounting device may include a setting portion. The method may include receiving setting of the predetermined area through the setting portion.

The above-described method of mounting components enables a user to set the above-described predetermined area.

A surface mounter disclosed herein includes the component mounting device, a component supply device configured to feed components at the plurality of component feeding positions arranged in one line, and a board transfer device configured to transfer a board to a mounting position at which the component is mounted by the component mounting device.

According to the above-described surface mounter, in the component mounting device including a plurality of holding member drive units, the time required to mount components can be reduced, and the feeding area of the components and the mounting area of the components are expanded.

In the component mounting device disclosed herein, the time required for mounting components is reduced, and the feeding area and the mounting area of components are expanded. Also, the method of mounting components disclosed herein reduces the time required for mounting components. Furthermore, in the surface mounter disclosed herein, the time required for mounting components can be reduced, and the feeding area and the mounting area of components are expanded.

DETAILED DESCRIPTION

A first embodiment is described with reference to FIG. 1 to FIG. 8. In the following description, a sentence saying "mounting an electronic component E1 (see FIG. 1) on a printed circuit board B1 (see FIG. 1)" means picking up an electronic component E1, which is fed at a component feeding position, by suction and placing the picked-up electronic component E1 on a mounting position on the printed circuit board B1.

(1) Overall Configuration of Surface Mounter

Figure 1:
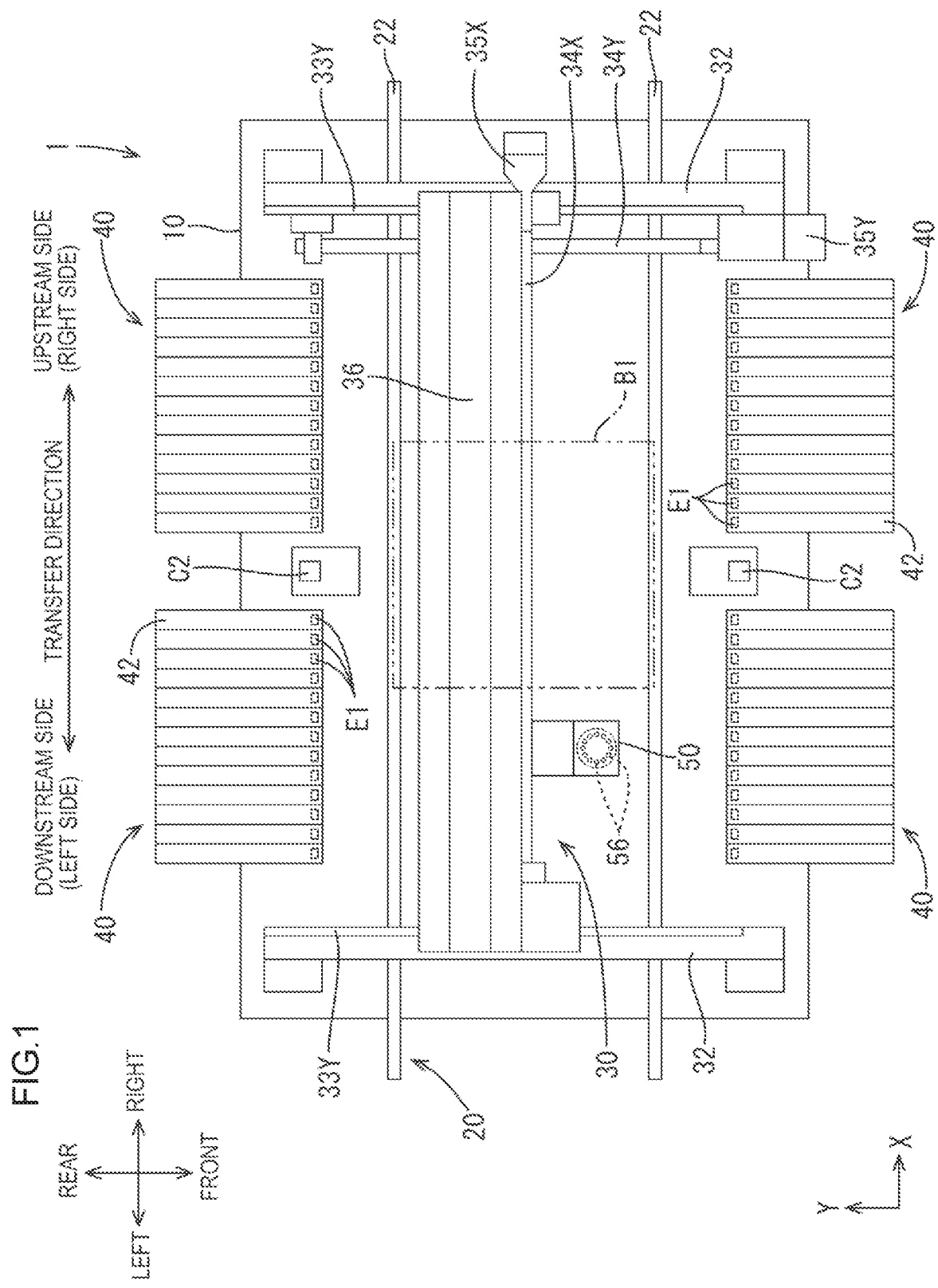
FIG. 1 is a plan view of a surface mounter according to a first embodiment.

As illustrated in FIG. 1, a surface mounter 1 according to this embodiment includes a base board 10, a transfer conveyor 20 (one example of a board transfer device) configured to transfer a printed circuit board B1 (one example of a board), a component mounting device 30 configured to mount an electronic component E1 (one example of a component) on the printed circuit board B1, and a component feeding device 40 configured to supply the electronic component E1 to the component mount device 30, for example.

The base board 10 has an oblong shape in a plan view and has a flat upper surface. A backup plate or the like for supporting the printed circuit board B1 during mounting of the electronic component E1 on the printed circuit board B1 is provided below the transfer conveyor 20 on the base board 10. In the following description, the longitudinal direction of the base board 10 (the left-right direction in FIG. 1) and the transfer direction of the transfer conveyor 20 are referred to as an X-axis direction. The width direction of the base board 10 (the front-rear direction in FIG. 1) is referred to as a Y-axis direction. The up-down direction of the base board 10 (the up-down direction in FIG. 2) is referred to as a Z-axis direction.

The transfer conveyor 20 is located at the substantially middle of the base board 10 in the Y-axis direction and is configured to transfer the printed circuit board B1 in the transfer direction (the X-axis direction). The transfer conveyor 20 includes a pair of conveyor belts 22 configured to circulate in the transfer direction. The printed circuit board B1 is positioned across the conveyor belts 22. The printed circuit board B1 is transferred from one side in the transfer direction (the right side in FIG. 1) along the conveyor belts 22 to an operation position (an area surrounded by a two-dot chain line in FIG. 1) on the base board 10 where the printed circuit board B1 is stopped for the mounting operation of the electronic component E1. Then, the printed circuit board B1 is transferred to the other side (the left side in FIG. 1) along the conveyor belts 22 and discharged.

Two component feeding devices 40, which are feeder type component feeding devices, are arranged side by side in the X-axis direction on each side of the transfer conveyor 20 (each side in the up-down direction in FIG. 1), i.e., the total of four component feeding devices 40. The component feeding devices 40 each include a plurality of feeders 42 arranged side by side in the left-right direction.

The feeders 42 each include a reel (not illustrated), around which a component feeding tape (not illustrated) holding the electronic components E1 is wound, and an electrical unwinding device (not illustrated), which is configured to unwind the component feeding tape from the reel, for example. The feeder 42 supplies the electronic components E1 one by one from component feeding positions located at the end adjacent to the transfer conveyor 20.

Here, as illustrated in FIG. 1, the component feeding positions are arranged in one line in the left-right direction. The distance between adjacent two of the component feeding positions is equal to a divisor of a diameter of an imaginary circle 66 (see FIG. 4), which is described later. The left-right direction is one example of an arrangement direction in which the component feeding positions are arranged.

The component mounting device 30 includes two supporting frames 32, which are disposed above the base board 10 and the component feeding device 40 described later, a rotary head 50, and a rotary head transfer mechanism (one example of a head transfer mechanism) configured to drive the rotary head 50. The supporting frames 32 extending in the Y-axis direction are positioned at the both sides of the base board 10 in the X-axis direction. An X-axis servomechanism and a Y-axis servomechanism, which constitute a rotary head transfer mechanism, are attached to the supporting frames 32. The rotary head 50 is movable in the X-axis direction and the Y-axis direction in a predetermined range of movement by the X-axis servomechanism and the Y-axis servomechanism.

The Y-axis servomechanism includes Y-axis guide rails 33Y, a Y-axis ball screw 34Y on which a ball nut (not illustrated) is threadably mounted, and a Y-axis servomotor 35Y. A head support 36 fixed to the ball nut is attached to each Y-axis guide rail 33Y. The ball nut is moved forward or rearward along the Y-axis ball screw 34Y when the Y-axis servomotor 35Y is energized. This moves the head support 36 fixed to the ball nut and the rotary head 50, which is described later, in the Y-axis direction along the Y-axis guide rails 33Y.

The X-axis servomechanism includes an X-axis guide rail (not illustrated), an X-axis ball screw 34X on which a ball nut (not illustrated) is threadably mounted, and an X-axis servomotor 35X. The rotary head 50 is attached to the X-axis guide rail in a movable manner in the axial direction of the X-axis guide rail. The ball nut is moved forward or backward along the X-axis ball screw 34X when the X-axis servomotor 35X is energized. This moves the rotary head 50 fixed to the ball nut in the X-axis direction along the X-axis guide rail.

(2) Structure of Rotary Head

Figure 2:
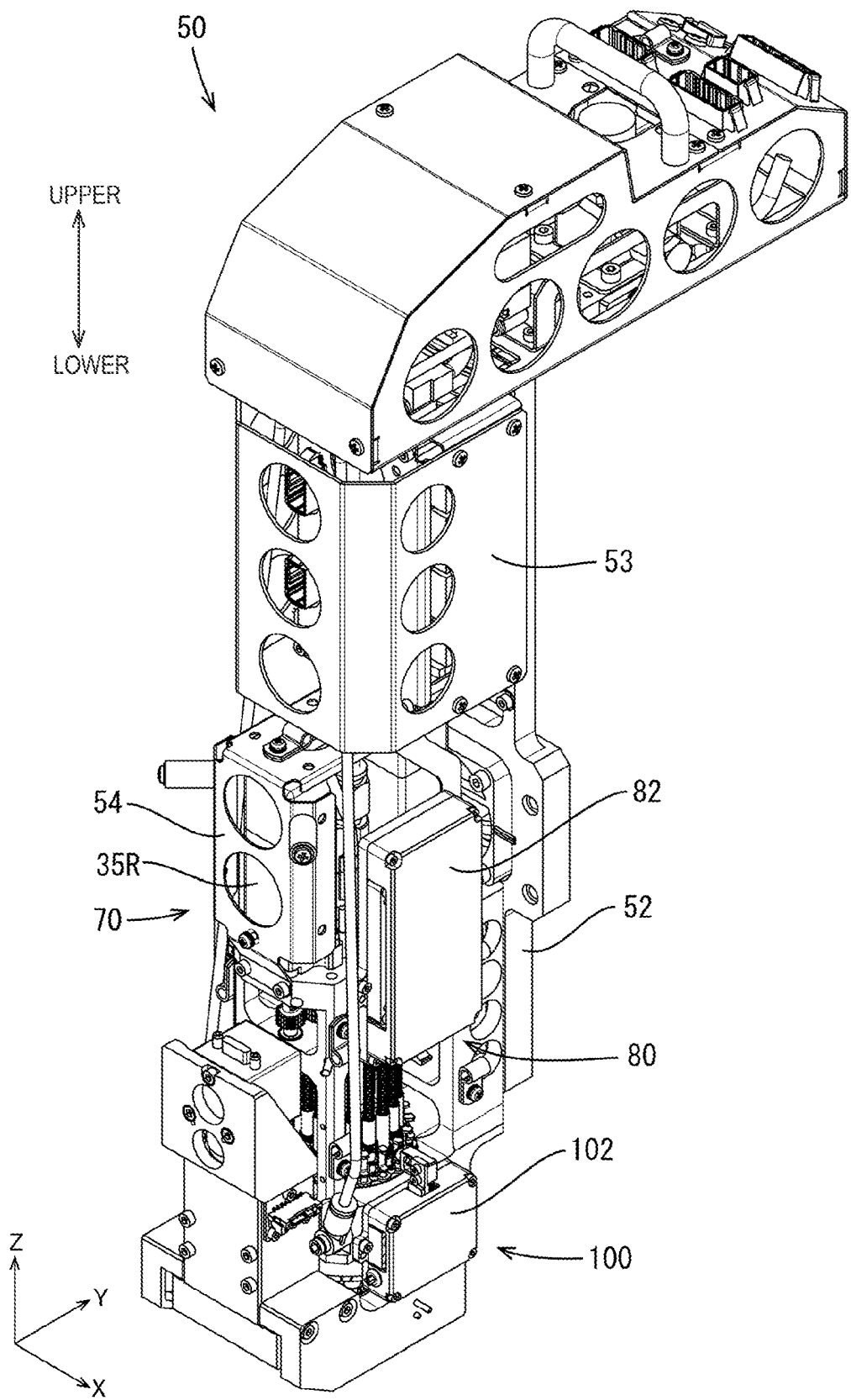
FIG. 2 is a perspective view of a rotary head.
Figure 3:
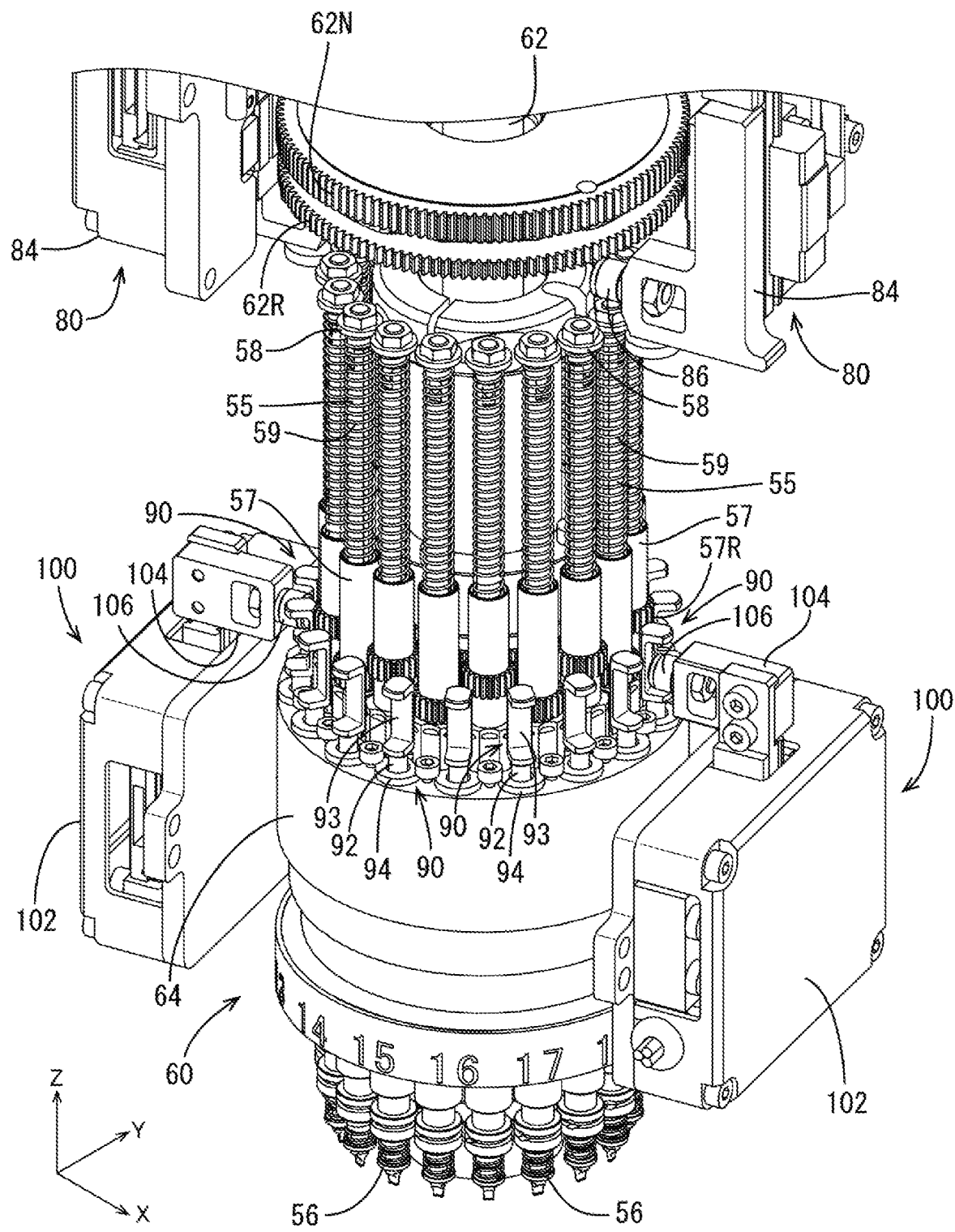
FIG. 3 is a magnified perspective view of a portion of the rotary head.

Next, the structure of the rotary head 50 is described in detail. As illustrated in FIG. 2, the rotary head 50 having an arm-like shape has a head body 52, which is a main body, and covers 53 and 54 covering the head body 52. The rotary head 50 is configured to pick up an electronic component E1, which is fed by the component feeding device 40, by suction (one way to hold) and place the electronic component E1 on the printed circuit board B1. As illustrated in FIG. 3, in the rotary head 50, eighteen nozzle shafts 55 are supported by the rotary body 60 in a movable manner in the Z-axis direction (the up-down direction).

As illustrated in FIG. 3, the rotary body 60 includes a shaft 62 having a cylindrical shape extending in the Z-axis direction and a shaft retainer 64 located around the shaft 62 at a lower portion of the rotary head 50 and having a diameter larger than the shaft 62. The shaft 62 of the rotary body 60 is supported by the head body 52 in a rotatable manner about the axis of the shaft 62 in both directions (i.e., a turnable manner).

The shaft 62 has a two-layered structure. The inner shaft 62 (hereinafter, referred to as an "N-axis") has an N-axis driven gear 62N coaxially disposed with the shaft 62 at the upper portion thereof. The outer shaft 62 (hereinafter, referred to as an "R-axis") has an R-axis driven gear 62R coaxially disposed with the shaft 62 at the upper portion thereof.

An N-axis drive unit (not illustrated) (one example of a rotary body drive portion) configured to rotate the rotary body 60 is disposed at a substantially center of the rotary head 50 in the Z-axis direction. The N-axis drive unit includes an N-axis servomotor 35N (see FIG. 5) and an N-axis driving gear (not illustrated) disposed on the output shaft of the N-axis servomotor 35N. The N-axis driving gear and the N-axis driven gear 62N are engaged together. When the N-axis servomotor 35N is energized, the rotary body 60 is rotated about a rotation axis 61 (see FIG. 4) extending in the Z-axis direction by a predetermined angle through the rotation of the N-axis driving gear and the N-axis driven gear 62N.

The shaft retainer 64 of the rotary body 60 has eighteen through holes arranged in the circumferential direction with equal distances therebetween. The cylindrical nozzle shafts 55, which extend through the shaft retainer 64 in the Z-axis direction through tubular shaft holders 57, are held in the respective through holes. As illustrated in FIG. 3, a pickup nozzle 56 (one example of a component holding member) configured to pick up an electronic component E1 by suction is attached to a lower portion of each of the nozzle shafts 55 protruding downward from the shaft retainer 64.

A negative pressure or a positive pressure is applied to the pickup nozzle 56. The pickup nozzles 56 are each configured to pick up and hold an electronic component E1 at the end portion by means of a negative pressure and to release the electronic component E1, which is held at the end portion, by means of a positive pressure. When the rotary body 60 is rotated by the N-axis drive unit, the nozzle shafts 55 and the pickup nozzles 56 attached to the nozzle shafts 55 are rotated about the rotation axis 61 of the rotary body 60.

Furthermore, as illustrated in FIG. 2, an R-axis drive unit 70 configured to rotate the nozzle shafts 55 about the respective axes is disposed at the substantially middle of the rotary head 50 in the Z-axis direction. The R-axis drive unit 70 includes an R-axis servomotor 35R and an R-axis driving gear (not illustrated) disposed on the output shaft of the R-axis servomotor 35R and engaged with the R-axis driven gear 62R. On the lower portion of the outer shaft 62 having the R-axis driven gear 62R thereon, a common gear (not illustrated) is disposed below the R-axis driven gear 62R.

As illustrated in FIG. 3, nozzle gears 57R are disposed on a portion of the respective shaft holders 57 coaxially with the respective axes. The nozzle gears 57R on the nozzle shafts 55 are engaged with the common gear. When the R-axis servomotor 35R is energized, the common gear is rotated through rotation of the R-axis driving gear and the R-axis driven gear 62R.

The rotation of the common gear rotates the shaft holders 57 due to the engagement of the common gear with the nozzle gears 57R. Then, since the shaft holders 57 and the nozzle shafts 55 are connected to each other through a ball spline mechanism, the eighteen nozzle shafts 55 are rotated about the respective axes in the same direction by the same angle at the same time due to the rotation of the common gear.

A spring retaining bolt 58 is threadably attached to an upper end of each of the nozzle shafts 55. A coil spring 59 in a compressed state between the spring retaining bolt 58 and the shaft holder 57 is disposed on the outer surface of each nozzle shaft 55. The nozzle shafts 55 are each biased upwardly by an elastic force of the coil spring 59.

Figure 4:
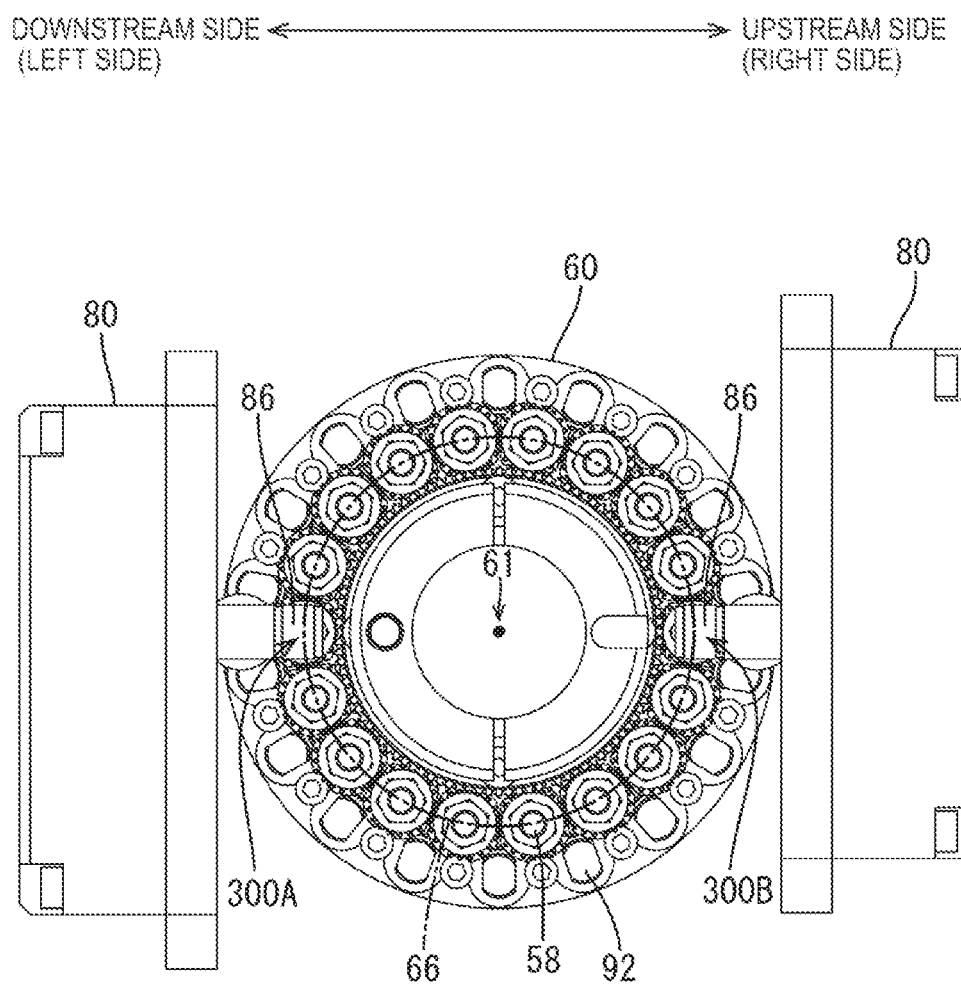
FIG. 4 is a top view of a rotary body and a Z-axis drive unit.

As illustrated in FIG. 3 and FIG. 4, the rotary head 50 includes two Z-axis drive units 80 (one example of holding member drive units) configured to move up and down two of the eighteen nozzle shafts 55 located at driving positions 300A and 300B in the direction along the shaft 62 of the rotary body 60 (the Z-axis direction, the up-down direction) relative to the rotary body 60. The driving positions 300A and 300B are located on the imaginary line 66 on which the nozzle shafts 55 are arranged.

The two Z-axis drive units 80 have the identical structure and are symmetrically arranged at the left and right sides of the rotary head 50 with the shaft 62 of the rotary body 60 therebetween. In other words, the two Z-axis drive units 80 are arranged on both sides of the rotary body 60 in an arrangement direction in which the component feeding positions are arranged.

The Z-axis drive unit 80 includes a box-like Z-axis drive source 82 (see FIG. 2) and a Z-axis movable portion 84 (see FIG. 3) extending downwardly from the Z-axis drive source 82. A Z-axis linear motor 35Z (see FIG. 5) for driving the Z-axis movable portion 84 by a linear force is disposed in the Z-axis drive source 82. The Z-axis movable portion 84 is supported relative to the Z-axis drive source 82 in a movable manner in a direction along the shaft 62 and is moved up and down by the Z-axis drive source 82 in the direction along the shaft 62.

As illustrated in FIG. 3 and FIG. 4, a cam follower 86 (hereinafter, referred to as a "Z-axis cam follower 86") is attached to a lower portion of the Z-axis movable portion 84 of the Z-axis drive unit 80 in a rotatable manner about the axis extending in the X-axis direction. The Z-axis movable portion 84 at the upward movement end is supported by the Z-axis drive source 82 such that the Z-axis cam follower 86 is located close to the upper end of the nozzle shaft 55 (i.e., the upper end of the spring retaining bolt 58). Thus, the nozzle shafts 55 are able to rotate about the shaft 62 when the Z-axis movable portions 84 are located at the upward movement end.

When the Z-axis movable portion 84 is moved down from the upward movement end by the Z-axis drive source 82, the Z-axis cam follower 86 comes in contact with the upper end of the nozzle shaft 55 that is located at the driving position to move the nozzle shaft 55 against an elastic force of the coil spring 59. The downward movement of the nozzle shaft 55 moves down the pickup nozzle 56 attached to the nozzle shaft 55 until the end of the pickup nozzle 56 comes close to the component feeding position or the printed circuit board B1. When the Z-axis movable portion 84 in this state is moved up, the nozzle shaft 55 and the pickup nozzle 56 are moved up by an elastic restoring force of the coil spring 59.

Furthermore, as illustrated in FIG. 3, the rotary head 50 includes switching devices 90 configured to switch the pressure applied to the pickup nozzles 56 between a negative pressure and a positive pressure. A total of eighteen switching devices 90 are disposed so as to correspond to the pickup nozzles 56 (the nozzle shafts 55). As illustrated in FIG. 4, the switching devices 90 are disposed between adjacent two of the nozzle shafts 55 on the outer side of the nozzle shafts 55 arranged on the imaginary circle 66. The switching devices 90 are arranged on an imaginary circle centered at the rotation axis 61 of the rotary body 60 with equal distances therebetween along the outer circumference of the shaft retainer 64, as in the same manner as the nozzle shafts 55.

As illustrated in FIG. 3, the switching devices 90 each include a cylindrical valve spool 92 (one example of a valve) and a tubular sleeve 94 housing a lower portion of the valve spool 92. The sleeves 94 are attached in the respective mounting holes in the shaft retainer 64. The valve spools 92 are each located in the sleeve 94 such that the axial direction thereof extends in the Z-axis direction (the up-down direction). Axial movement of the valve spool 92 switches the pressure applied to the pickup nozzle 56 between a negative pressure and a positive pressure. In this embodiment, the application route of the negative pressure or the positive pressure to the sleeve 94 is not described.

As illustrated in FIG. 3, the valve spools 92 each have a contact portion 93 having a laterally facing U-like shape at the upper portion. A V-axis cam follower 106 of a V-axis drive unit 100, which is described later, comes in contact with the contact portion 93. The valve spools 92 are arranged such that openings of the U-like shaped contact portions 93 face the outside (a side opposite the shaft 62).

Furthermore, as illustrated in FIG. 2 and FIG. 3, the rotary head 50 includes two V-axis drive units 100 (one example of valve drive units) each configured to move the valve spool 92 of the switching device 90 in the Z-axis direction (the up-down direction). The two V-axis drive units 100, which have the identical structure, are symmetrically arranged at the left and right sides of the rotary head 50 with the shaft 62 of the rotary body 60 therebetween.

As illustrated in FIG. 2 and FIG. 3, the V-axis drive units 100 each include a box-like V-axis drive source 102 and a V-axis movable portion 104 extending upward from the V-axis drive source 102. A V-axis linear motor 35V (see FIG. 5) configured to drive the V-axis movable portion 104 by a linear force is disposed in the V-axis drive source 102. The V-axis movable portion 104 is supported relative to the V-axis drive source 102 in a movable manner in a direction along the shaft 62 and is moved up and down by the V-axis drive source 102 in the direction along the shaft 62.

As illustrated in FIG. 3, a cam follower 106 (hereinafter, referred to as a "V-axis cam follower 106") is attached to the upper portion of the V-axis movable portion 104 of the V-axis drive unit 100 in a rotatable manner about the axis extending in the X-axis direction. The V-axis movable portion 104 is supported by the V-axis drive source 102 such that the V-axis cam follower 106 is positioned in the U-like shaped contact portion 93 of the valve spool 92 that corresponds to the nozzle shaft 55 located at the driving position.

When the V-axis movable portion 104 is moved up by the V-axis drive source 102, the V-axis cam follower 106 comes in contact with the contact portion 93 and pushes up the valve spool 92, and thus a negative pressure is applied to the pickup nozzle 56. Contrary to this, when the V-axis movable portion 104 is moved down by the V-axis drive source 102, the V-axis cam follower 106 comes in contact with the contact portion 93, which is located on either side of the V-axis cam follower 106, and pushes down the valve spool 92, and thus a positive pressure is applied to the pickup nozzle 56.

Since the rotation axis of the V-axis cam follower 106 extends in the X-axis direction, the rotation direction of the V-axis cam follower 106 is substantially the same as the tangential direction of the circular trajectory of the nozzle shafts 55 circled by the rotary body 60. Thus, when the rotary body 60 is rotated while the valve spool 92 is moved up or down by the V-axis cam follower 106, the V-axis cam follower 106 is rotated by a frictional force generated between the V-axis cam follower 106 and two opposing portions 93A while being in contact with the opposing portions 93A. Thus, the valve spool 92 is able to be moved up or down with the nozzle shafts 55 being kept circled.

Figure 5:
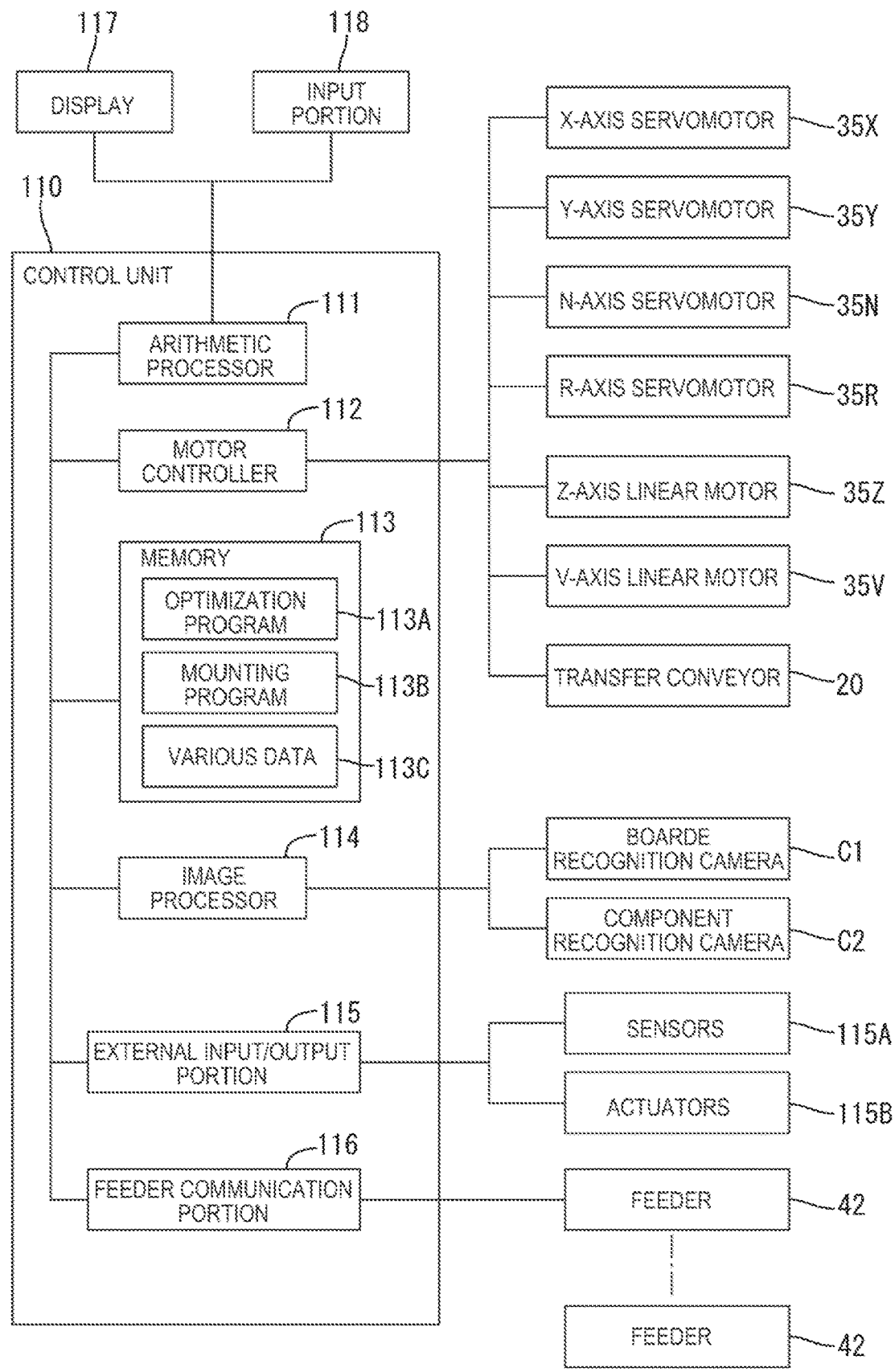
FIG. 5 is a block diagram illustrating an electrical configuration of a surface mounter.

The rotary head 50 is provided with a board recognition camera C1 (see FIG. 5). The board recognition camera C1 is configured to move together with the rotary head 50 and capture an image of a predetermined portion of the printed circuit board B1 stopped at the operation position. In addition, component recognition cameras C2 (see FIG. 1) are fixed to the base board 10 at positions near the operation position. The component recognition cameras C2 are configured to capture an image of the electronic component E1 picked up at the component feeding position of the component feeding device 40 by the pickup nozzle 56.

(3) Electrical Configuration of Surface Mounter

Next, an electrical configuration of the surface mounter 1 is described with reference to FIG. 5. The entire of the main body of the surface mounter 1 is controlled by a control unit 110. The control unit 110 includes an arithmetic and control unit 111 such as a CPU. A motor controller 112, a memory 113, an image processer 114, an external input/output portion 115, a feeder communication portion 116, a display 117, and an input portion 118 are each connected to the arithmetic and control unit 111.

The motor controller 112 is configured to drive the X-axis servomotor 35X and the Y-axis servomotor 35Y of the component mounting device 30 in accordance with a mounting program 113B in the memory 113, and drive the N-axis servomotor 35N, the R-axis servomotor 35R, the Z-axis linear motor 35Z, and the V-axis linear motor 35V of the rotary head 50. In addition, the motor controller 112 is configured to drive the transfer conveyor 20 in accordance with the mounting program 113B.

The memory 113 includes a Read Only Memory (ROM) configured to store programs or the like for controlling the CPU and Random Access Memory (RAM) configured to temporally store various data during the operation of the device. The memory 113 stores an optimization program 113A, the mounting program 113B, and various data 113C.

The various data 113C include board information relating to the number of printed circuit boards B1, which are mounting targets, component information relating to the number or type of electronic components E1 to be mounted on the printed circuit boards B1, and mounting position information relating to mounting positions of the electronic components E1 on the printed circuit boards B1, and data relating to the number or type of the electronic components E1 held by the feeders 42 of the component feeding device 40.

The control unit 110 is configured to run the optimization program 113A before the start of mounting of the electronic components E1 to generate a control sequence having the control information, such as a pickup order of the electronic components E1 and a mounting order of the electronic components E1, using the various data 113C. Then, when directed to mount the electronic components E1, the control unit 110 runs the mounting program 113B to control the components of the surface mounter 1 in accordance with the generated control sequence.

The image processor 114 is configured to receive imaging signals output from the board recognition camera C1 and the component recognition cameras C2. The image processor 114 is configured to analyze the images of the components and the images of the boards using the imaging signals provided by the cameras C1 and C2.

The external input/output portion 115 is an interface and is configured to receive detection signals from various sensors 115A disposed in the body of the surface mounter 1. In addition, the external input/output portion 115 is configured to control the operation of actuators 115B using control signals output from the arithmetic processor 111.

The feeder communication portion 116 is connected to the control unit 110 of each feeder 42 of the component feeding device 40 to collectively control the feeders 42. The control unit 110 of each feeder 42 is configured to control the motor that sends out the component feeding tape.

The display 117 includes a liquid crystal display device having a display screen, for example, and is configured to display the state of the surface mounter 1, for example, on the display screen. The input portion 118 (one example of a setting portion) is a key board, for example, and is configured to receive external manual input.

The above-described surface mounter 1 in automatic operation alternately goes into a transfer mode, in which the printed circuit board B1 is transferred by the transfer conveyor 20 to an operation position on the base board 10, and a mounting mode in which the electronic component E1 is mounted on the print board B1 transferred to the operation position. In the mounting mode, a pickup operation and a mounting operation are alternately performed. In the pickup operation, the electronic components E1 fed by the component feeding devices 40 are picked up by the respective eighteen pickup nozzles 56. In the mounting operation, the rotary head 50 is transferred and the electronic components E1 are placed on the printed circuit boards B1.

(5) Setting of Control Sequence Using Optimization Program

Figure 6:
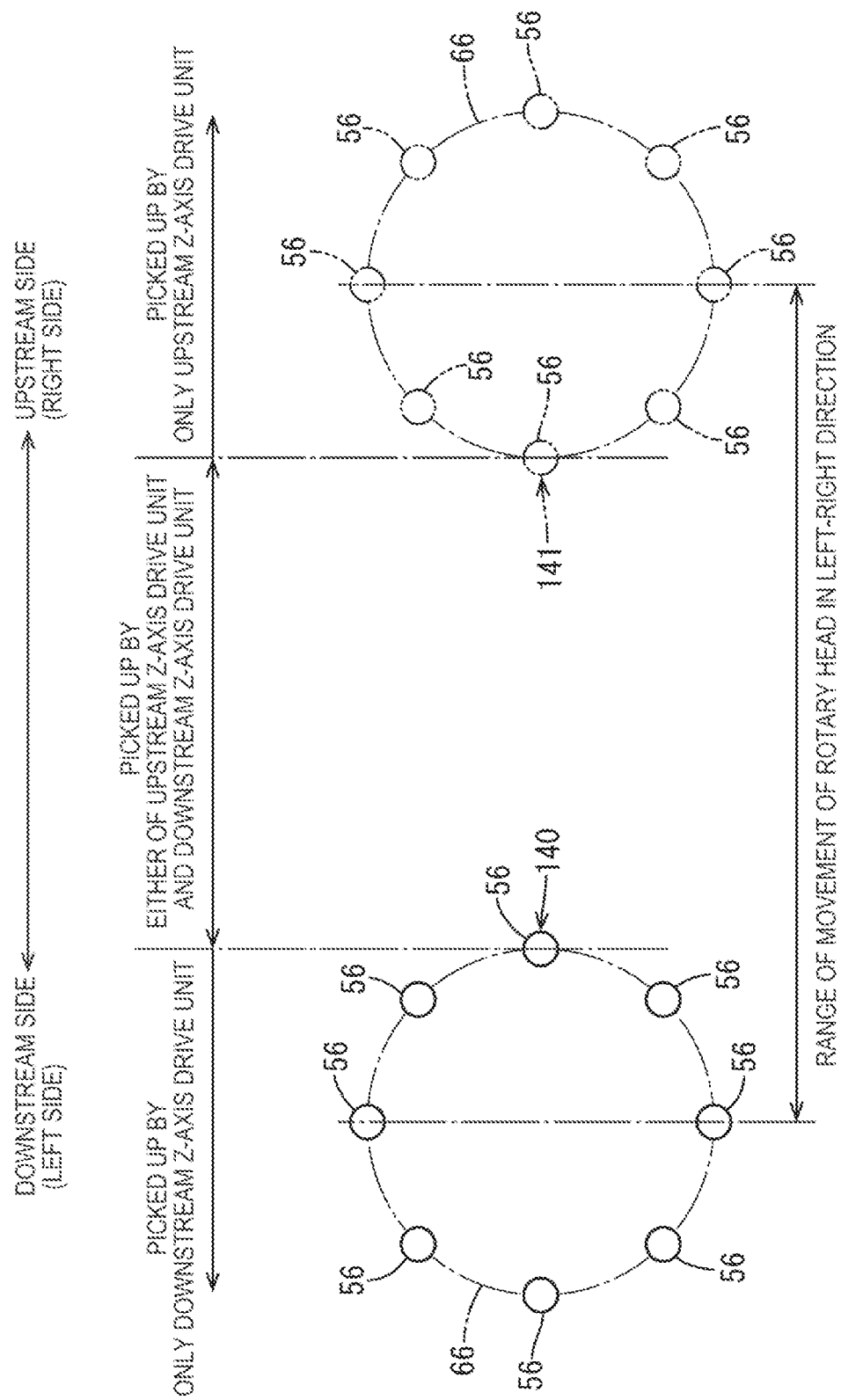
FIG. 6 is a schematic view indicating a range of movement of the rotary head.
Figure 7:
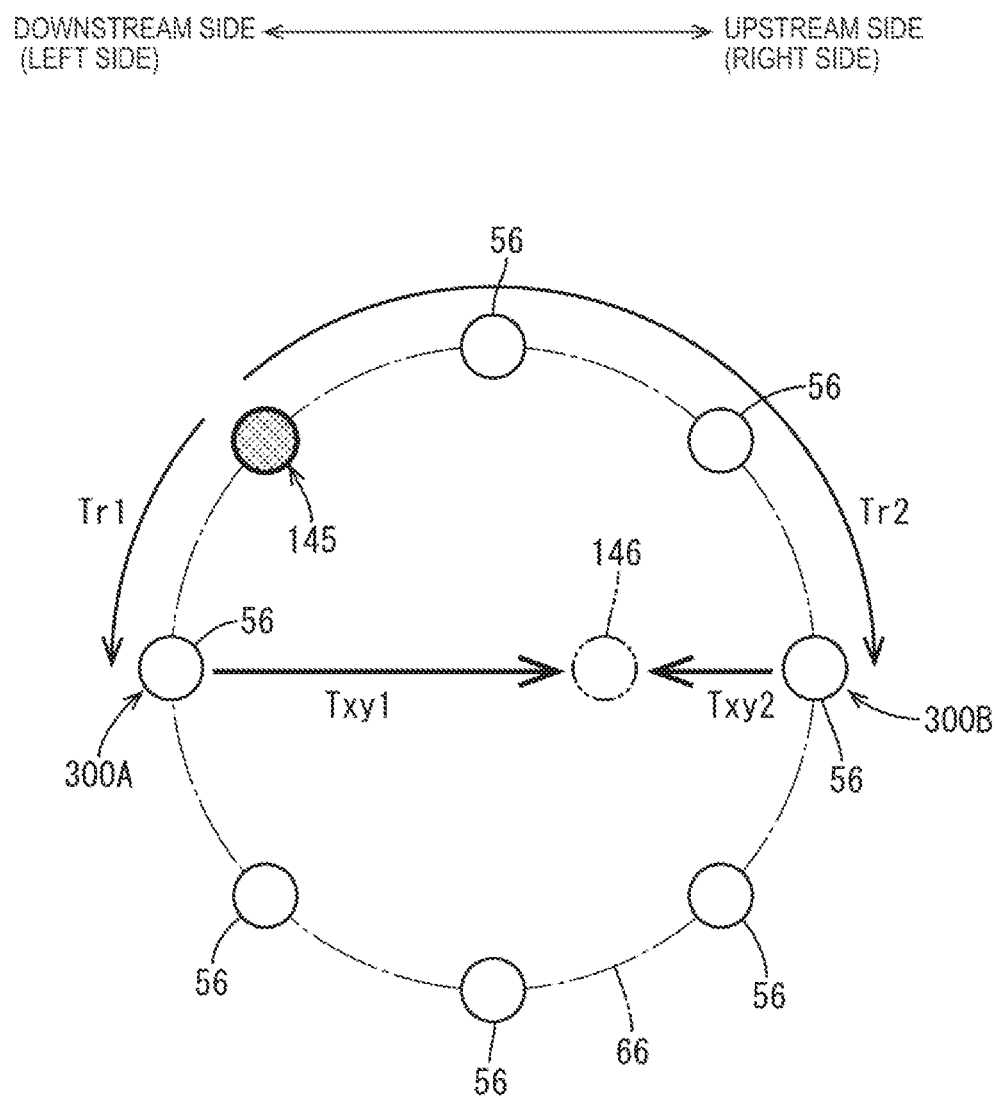
FIG. 7 is a schematic view for explaining setting of a component holding member drive unit used for picking up.
Figure 8:
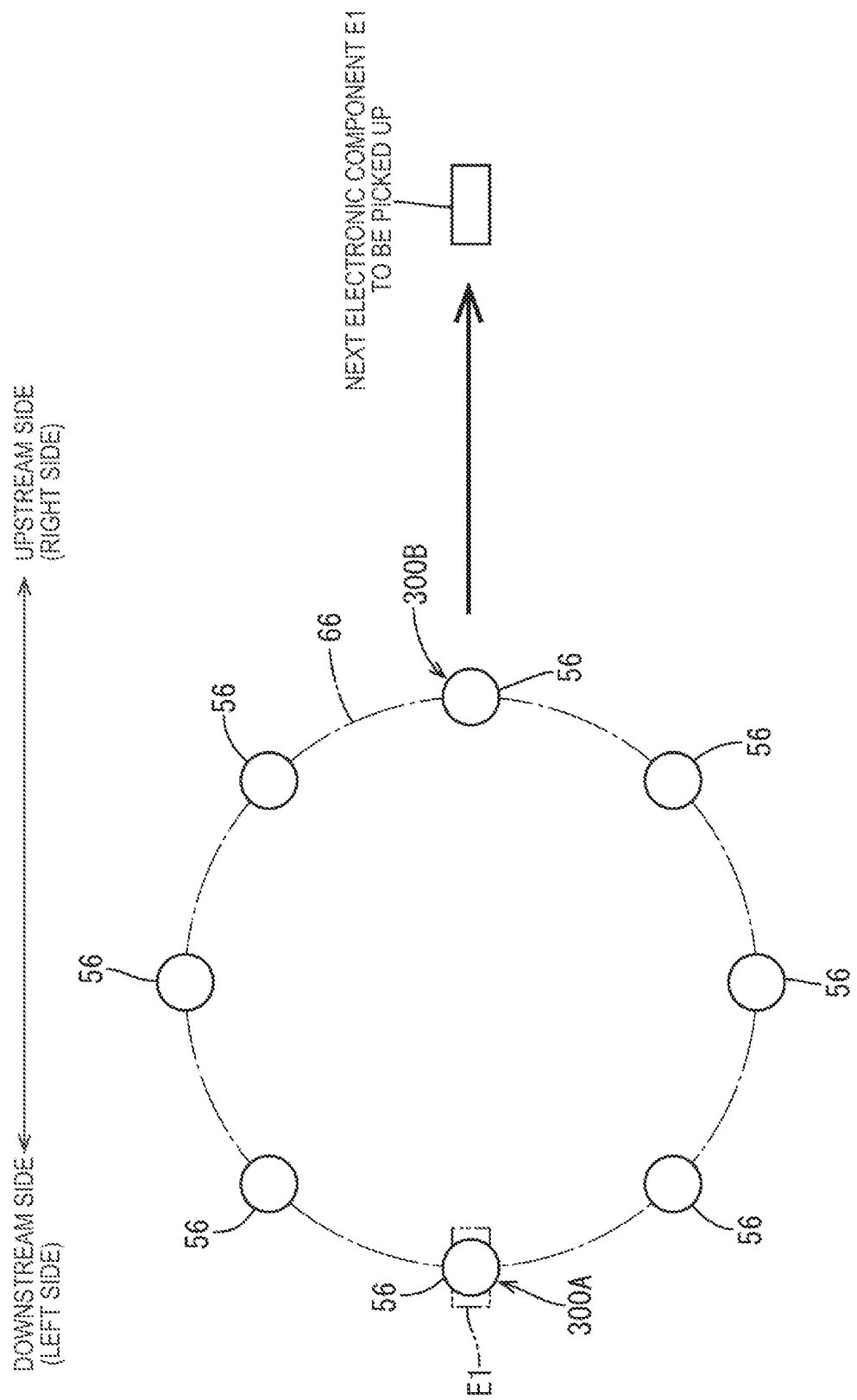
FIG. 8 is a schematic view for explaining timing of downward movement of a pickup nozzle.

As described above, the control sequence includes the control information, such as the pickup order of the electronic components E1 and the mounting order of the electronic components E1. In addition, the control sequence according to the embodiment includes other control information than the above-described information. This is described in detail below. In FIG. 6 to FIG. 8, which are used in the explanation below, only eight pickup nozzles 56 are illustrated for ease of explanation.

(5-1) Control Information about Picking Up

First, among the control information included in the control information in the control sequence, the control information about picking up of the electronic components E1 is described. In the control sequence, as the control information about picking up of the electronic components E1, information about which of the Z-axis drive units 80 is used to pick up the electronic component E1, concurrent picking up of the electronic components E1, and timing of downward movement of the pickup nozzle 56 to pick up the electronic component E1, for example, are set.

(5-1-1) Z-Axis Drive Unit Used to Pick Up Electronic Components

First, with reference to FIG. 6, areas where the Z-axis drive units 80 are able to pick up or place the electronic components E1 are described. In FIG. 6, a position 140 is a position where a driving position 300B of the Z-axis drive unit 80 at an upstream side (one example of a right side) is located when the rotary head 50 is moved to a downstream (one example of a left side) end of the range of movement, and a position 141 is a position where a driving position 300A of the Z-axis drive unit 80 at a downstream side is located when the rotary head 50 is moved to an upstream end of the range of movement.

The electronic components E1 to be fed at the component feeding positions in the area between the position 140 and the position 141 are able to be picked up by either of the Z-axis drive unit 80 at the upstream side and the Z-axis drive unit 80 at the downstream side. However, the electronic components E1 fed at the component feeding positions located on the upstream side of the position 141 are able to be picked up only by the Z-axis drive unit 80 at the upstream side, and the electronic components E1 fed at the component feeding positions located on the downstream side of the position 140 are able to be picked up only by the Z-axis drive unit 80 at the downstream side.

Next, with reference to FIG. 7, the control operation of the control unit 110, which is a basic thing to know before the setting of the Z-axis drive unit 80 used to pick up the electronic component, is described. In this embodiment, the order of picking up of the electronic components E1 by the pickup nozzles 56 is calculated in advance. In FIG. 7, a position 145 is a position where the next pickup nozzle 56 (a position on the imaginary circle 66) to pick up the electronic component E1 is located, and a position 146 is a component feeding position where the next electronic component E1 to be picked up is fed.

The control unit 110 may direct the next pickup nozzle 56 (the pickup nozzle 56 at the position 145 in FIG. 7) to pick up an electronic component E1 after one of the pickup nozzles 56 picked up an electronic component E1. In such a case, the control unit 110 concurrently causes a rotational transfer movement and a head transfer movement. In the rotational transfer movement, the next pickup nozzle 56 to pick up the electronic component E1 (hereinafter, simply referred to as the "next pickup nozzle 56") is rotated to the driving position 300 of the Z-axis drive unit 80. In the head transfer movement, the rotary head 50 is moved such that the driving position 300 of the Z-axis drive unit 80 moves to the component feeding position where the next electronic component E1 to be picked up is fed.

Such transfer movements are started at almost the same time. The longer of time Tr, which is time required for the rotational transfer movement, and time Txy, which is time required for the head transfer movement, is transfer time T for the Z-axis drive unit 80 required when the next pickup nozzle 56 picks up the electronic component E1.

(5-1-1-1) Setting of Z-Axis Drive Unit Used to Pick Up Electronic Components Fed at Component Feeding Positions Between Position 140 and Position 141

For example, Tr1, Txy1, T1, Tr2, Txy2, and T2 are defined as follows.

Tr1 indicates time required to rotate the next pickup nozzle 56 to the driving position 300A of the Z-axis drive unit 80 at the downstream side.

Txy1 indicates time required for moving the driving position 300A of the Z-axis drive unit 80 at the downstream side to the component feeding position 146 where the next electronic component E1 to be picked up is fed.

T1 is the longer of Tr1 and Txy1.

Tr2 indicates time required to rotate the next pickup nozzle 56 to the driving position 300B of the Z-axis drive unit 80 at the upstream side.

Txy2 indicates time required for moving the driving position 300B of the Z-axis drive unit 80 at the upstream side to the component feeding position 146 where the electronic component E1 to be picked up is fed.

T2 is the longer of Tr2 and Txy2.

In this case, if T1<T2, the Z-axis drive unit 80 at the downstream side requires less time for picking up. Conversely, if T1>T2, the Z-axis drive unit 80 at the upstream side requires less time for picking up.

In view of the above, with respect to the electronic components E1 to be fed at the component feeding positions between the position 140 and the position 141 indicated in FIG. 6, the control unit 110 calculates the transfer time T for each of the Z-axis drive units 80. The transfer time T is calculated from the position of the rotary head 50 at the end of picking up of the previous electronic component E1 placed before the target electronic component E1, the position (on the imaginary circle 66) of the next pickup nozzle 56, the component feeding position of the target electronic component E1, the rotation speed of the rotary body 60, and transfer speed of the rotary head 50, for example. The control unit 110 determines one of the Z-axis drive units 80 that has the shorter transfer time T as the Z-axis drive unit 80 that picks up the target electronic component E1.

(5-1-1-2) Setting of Z-Axis Drive Unit Used to Pick Up Electronic Components Fed at Component Feeding Positions Located Upstream of Position 141 and Component Feeding Positions Located Downstream of Component Feeding Position 140

The control unit 110 collectively sets the Z-axis drive unit 80 at the upstream side as the Z-axis drive unit 80 that picks up the electronic components E1 fed at the component feeding positions located upstream of the position 141 without calculating the above-described transfer time T1 and T2.

The control unit 110 also collectively sets the Z-axis drive unit 80 at the downstream side as the Z-axis drive unit 80 that picks up the electronic components E1 fed at the component feeding positions located downstream of the position 140 without calculating the above-described transfer times T1 and T2.

(5-1-2) Concurrent Picking Up of Electronic Components

When the pickup nozzle 56 at the driving position 300 of one of the Z-axis drive units 80 is ready to pick up an electronic component E1, the next pickup nozzle 56 may be located at the driving position 300 of the other of the Z-axis drive units 80 and the component feeding position where the next electronic component E1 to be picked up is fed may be located below the driving position 300 of the other of the Z-axis drive units 80. In such a case, the control unit 110 sets the two pickup nozzles 56 to concurrently pick up the electronic components E1 at almost the same time.

(5-1-3) Downward Movement Timing of Pickup Nozzle for Picking Up of Electronic Component (No. 1)

As described above, the transfer time T is the longer of the time Tr required for the rotational transfer movement of the pickup nozzle 56 and the time Txy required for the head transfer movement. In this case, if Txy>Tr, the pickup nozzle 56 is located at the driving position 300 of the Z-axis drive unit 80 before the completion of transfer of the rotary head 50.

When the pickup nozzle 56 is located at the driving position 300 of the Z-axis drive unit 80 before the completion of transfer of the rotary head 50, the pickup nozzle 56 may be moved downward before the completion of transfer of the rotary head 50. This reduces time required to pick up the electronic component E1 compared with the case where the pickup nozzle 56 is moved downward after the completion of transfer of the rotary head 50.

Then, if Txy>Tr, the control unit 110 sets the downward movement of the pickup nozzle 56 to start before the completion of transfer of the rotary head 50. Thus, the downward movement of the pickup nozzle 56 starts before the completion of transfer of the rotary head 50.

However, when the pickup nozzle 56 is moved downward before the completion of transfer of the rotary head 50, the pickup nozzle 56 may come in contact with the already mounted electronic components E1 on the pathway of the pickup nozzle 56. To avoid the contact, the control unit 110 calculates the range of downward movement that keeps the pickup nozzle 56 being transferred with the rotary head 50 away from the mounted electronic components E1. The calculation is performed using degree of warping of the printed circuit board B1, and the height of the electronic components E1 on the pathway, for example. When the pickup nozzle 56 is moved down before the completion of transfer of the rotary head 50, the control unit 110, which is configured to run the mounting program 113B, moves down the pickup nozzle 56 by the calculated range of downward movement.

(5-1-4) Downward Movement Timing of Pickup Nozzle for Picking Up of Electronic Component (No. 2)

As described above, when the pickup nozzle 56 located at the driving position 300 of one of the Z-axis drive units 80 is ready to pick up an electronic component E1, the next pickup nozzle 56 to pick up an electronic component E1 may be located at the driving position 300 of the other of the Z-axis drive units 80. In such a case, if the component feeding position where the next electronic component E1 to be picked up is fed is located below the driving position 300 of the other of the Z-axis drive units 80, the concurrent picking up is able to be performed as described above.

However, in some cases, the component feeding position where the next electronic component E1 to be picked up is fed is not located below the driving position 300 of the other of the Z-axis drive units 80. Thus, as illustrated in FIG. 8, at the time of picking up of an electronic component E1 with the pickup nozzle 56 at the driving position 300A of one of the Z-axis drive units 80 (the Z-axis drive unit 80 at the downstream side in FIG. 8), if the next pickup nozzle 56 to pick up an electronic component E1 is located at the driving position 300B of the other of the Z-axis drive units 80 (the Z-axis drive unit 80 at the upstream side in FIG. 8) and the component feeding position of the next electronic component E1 to be picked up is not located below the driving position 300B of the other of the Z-axis drive units 80, the control unit 110 sets the downward movement of the pickup nozzle 56 by the other of the Z-axis drive units 80 to start before the start of transfer of the rotary head 50.

More specifically described, "the start of transfer of the rotary head 50" is when the rotary head 50 starts to move such that the driving position 300B of the other of the Z-axis drive units 80 moves to the next component feeding position (the component feeding position where the next electronic component E21 to be picked up is fed) after one electronic component E1 is picked up by the pickup nozzle 56 at the driving position 300A of the one of the Z-axis drive units 80.

Also in this case, the control unit 110 calculates the range of downward movement that keeps the pickup nozzle 56 away from other electronic components E1 and moves down the pickup nozzle 56 by the calculated range of downward movement.

(5-2) Control Information about Placement

Next, among the control information included in the control sequence, control information about mounting of the electronic component E1 is described. In the control sequence, as the control information about mounting of the electronic components E1, information about which of the Z-axis drive units 80 is used to place the electronic component E1 and timing of downward movement of the pickup nozzle 56 for mounting of the electronic component E1, for example, are set.

(5-2-1) Z-Axis Drive Unit Used to Place Electronic Components

With reference to FIG. 7, which is described above, the setting of the Z-axis drive unit 80 used to place the electronic component E1 is described. In FIG. 7, the pickup nozzle 56 at the position 145 is the pickup nozzle 56 holding the next electronic component E1 to be placed, and the position 146 is a position where the next electronic component is to be placed.

For example, Tr1, Txy1, T1, Tr2, Txy2, and T2 are defined as follows.

Tr1 indicates time required to rotate the pickup nozzle 56 holding the next electronic component E1 to be placed to the driving position 300A of the Z-axis drive unit 80 at the downstream side.

Txy1 indicates time required for moving the driving position 300A of the Z-axis drive unit 80 at the downstream side to the mounting position 146 of the next electronic component E1.

T1 is the longer of Tr1 and Txy1.

Tr2 indicates time required to rotate the pickup nozzle 56 holding the electronic component E1 to the driving position 300B of the Z-axis drive unit 80 at the upstream side.

Txy2 indicates time required for moving the driving position 300B of the Z-axis drive unit 80 at the upstream side to the mounting position 146 of the electronic component E1.

T2 is the longer of Tr2 and Txy2.

In this case, if T1<T2, the Z-axis drive unit 80 at the downstream side requires less time for mounting. Conversely, if T1>T2, the Z-axis drive unit 80 at the upstream side requires less time for mounting.

In view of the above, with respect to the electronic components E1 to be placed at the mounting positions between the position 140 and the position 141 indicated in FIG. 6, the control unit 110 calculates the transfer time T for each of the Z-axis drive units 80. The transfer time T is calculated from the position of the rotary head 50 at the end of mounting of the previous electronic component E1 placed before the target electronic component E1, the position (on the imaginary circle 66) of the pickup nozzle 56 holding the electronic component E1, the mounting position of the target electronic component E1 on the printed circuit board B1, the rotation speed of the rotary body 60, and transfer speed of the rotary head 50, for example. The control unit 110 determines one of the Z-axis drive units 80 having the shorter transfer time T as the Z-axis drive unit 80 that places the target electronic component E1.

The control unit 110 collectively sets the Z-axis drive unit 80 at the upstream side as the Z-axis drive unit 80 that places the electronic components E1 on the mounting positions located upstream of the position 146. The control unit 110 also collectively sets the Z-axis drive unit 80 at the downstream side as the Z-axis drive unit 80 that places the electronic components E1 on the mounting positions located downstream of the position 145.

(5-2-2) Downward Movement Timing of Pickup Nozzle for Placement of Electronic Component (No. 1)

As described above, the transfer time T is the longer of the time Tr required for the rotational transfer movement of the pickup nozzle 56 and the time Txy required for the head transfer movement. In this case, if Txy>Tr, the pickup nozzle 56 is located at the driving position 300 of the Z-axis drive unit 80 before the completion of transfer of the rotary head 50.

When the pickup nozzle 56 is located at the driving position 300 of the Z-axis drive unit 80 before the completion of transfer of the rotary head 50, the pickup nozzle 56 may be moved downward before the completion of transfer of the rotary head 50. This reduces time required for the mounting of the electronic component E1 compared with the case where the pickup nozzle 56 is moved downward after the completion of transfer of the rotary head 50.

Then, if Txy>Tr, the control unit 110 sets the downward movement of the pickup nozzle 56 to start before the completion of transfer of the rotary head 50. Thus, the downward movement of the pickup nozzle 56 starts before the completion of transfer of the rotary head 50.

However, when the pickup nozzle 56 is moved downward, the electronic component E1 held by the pickup nozzle 56 may come in contact with the already placed electronic components E1 on the pathway of the electronic component E1 held by the pickup nozzle 56. To avoid the contact, the control unit 110 calculates the range of downward movement that keeps the electronic component E1 held by the pickup nozzle 56 being transferred with the rotary head 50 away from the other electronic components E1. The calculation is performed using degree of warping of the printed circuit board B1, the height of the electronic components E1 on the pathway, and the height of the electronic component E1 held by the pickup nozzle 56, for example. Then, the control unit 110, which is configured to run the mounting program 113B, moves down the pickup nozzle 56 by the calculated range of downward movement during the transfer of the rotary head 50.

(5-2-3) Downward Movement Timing of Pickup Nozzle for Placement of Electronic Component (No. 2)

When the other of the Z-axis drive units 80 is used to place the electronic component E1, the pickup nozzle 56 at the driving position 300 of the other of the Z-axis drive units 80 may be holding the next electronic component E1 to be placed. In such a case, the pickup nozzle 56 is able to be moved downward by the other of the Z-axis drive units 80 before the start of the movement of the rotary head 50.

Here, "the start of transfer of the rotary head 50" is when the rotary head 50 starts to move such that the driving position 300 of the other of the Z-axis drive units 80 moves to the next mounting position (the position where the electronic component E1 held by the pickup nozzle 56 at the driving position 300 of the other of the Z-axis drive unit 80 is to be placed) after the mounting of the electronic component E1 using the one of the Z-axis drive units 80.

Thus, at the time of mounting of the electronic component E1 using the one of the Z-axis drive units 80, if the pickup nozzle 56 at the driving position 300 of the other of the Z-axis drive units 80 is holding the next electronic component E1 to be placed, the control unit 110 sets the downward movement of the pickup nozzle 56 by the other of the Z-axis drive units 80 to start before the start of transfer of the rotary head 50.

Also in this case, the control unit 110 calculates the range of downward movement that keeps the electronic component E1 held by the pickup nozzle 56 away from the other electronic components E1 and moves down the pickup nozzle 56 by the calculated range of downward movement.

(6) Advantages of Embodiment

In the component mounting device 30 according to the first embodiment described above, since the two Z-axis drive units 80 are arranged in the arrangement direction of the component feeding positions, the two Z-axis drive units 80 are able to concurrently pick up the electronic components E1. This configuration requires less time for picking up of the electronic components E1, leadings to a reduction in time required to mount the electronic components E1.

In the component mounting device 30, the two Z-axis drive units 80 are arranged with the rotary body 60 therebetween in the arrangement direction. Compared with the case where the two Z-axis drive units 80 are located between the ends of the rotary body 60 in the arrangement direction, this configuration enlarges the feeding area and the mounting area of the electronic components E1 in the arrangement direction without changing the range of movement of the rotary head 50.

Thus, according to the component mounting device 30, in the component mounting device 30 including a plurality of Z-axis drive units 80, the time required to mount the electronic components E1 is reduced and the feeding area and the mounting area of the electronic components E1 are enlarged.

Furthermore, in the component mounting device 30, the component feeding positions are arranged in the transfer direction of the printed circuit board B1. In other words, the two Z-axis drive units 80 are arranged in the transfer direction of the printed circuit board B1. In this configuration, the mounting area is long in the transfer direction compared with the case where the two Z-axis drive units 80 are arranged in a direction perpendicular to the transfer direction. Thus, if the printed circuit board B1 is long in the transfer direction, the mounting area is sufficiently long.

In the method of mounting components according to the first embodiment, since one of the Z-axis drive units 80 that has the shorter transfer time T is used when the electronic component E1 is picked up by the pickup nozzle 56, the time required to mount the electronic components E1 is further reduced.

Furthermore, in the method of mounting components according to the first embodiment, since the transfer time T is not calculated with respect to the electronic components E1 to be fed at the component feeding positions located downstream of the position 140 in FIG. 6 (the left side) and with respect to the electronic components E1 to be fed at the component feeding positions located upstream (the right side) of the position 141, the time for calculation required in setting of the Z-axis drive unit 80 used to pick up the electronic component E1 is reduced.

Furthermore, in the method of mounting components according to the first embodiment, at the time of picking up of an electronic component E1 with the pickup nozzle 56 using the other of the Z-axis drive units 80, if the next pickup nozzle 56 to pick up the next electronic component E1 is located at the driving position 300 of the other of the Z-axis drive units 80 and the component feeding position of the next electronic component E1 to be picked up is not located below the driving position 300 of the other of the Z-axis drive units 80, the downward movement of the pickup nozzle 56 by the other of the Z-axis drive units 80 starts before the start of transfer of the rotary head 50. This further reduces the time required to mount the electronic components E1.

For example, if the next pickup nozzle 56 to pick up the electronic component E1 is not located at the driving position 300 of the other of the Z-axis drive units 80, the rotary body 60 needs to be rotated such that the next pickup nozzle 56 is located at the driving position 300 of the other of the Z-axis drive units 80. The downward movement of pickup nozzle 56 is not able to be started immediately by the other of the Z-axis drive units 80. Although it is advantageous in reduction of time to concurrently perform the rotational transfer of the rotary body 60 and the transfer of the rotary head 50, the concurrent movements do not allow the downward movement of the pickup nozzle 56 to start before the start of transfer of the rotary head 50.

If the next pickup nozzle 56 to pick up the electronic component E1 is located at the driving position 300 of the other of the Z-axis drive units 80, the pickup nozzle 56 is able to start to move downward before the start of transfer of the rotary head 50. Thus, the pickup nozzle 56 at the driving position 300 of the other of the Z-axis drive units 80 is able to pick up the electronic component E1 sooner. This reduces the time required to mount the electronic component E1.

Furthermore, in the method of mounting components according to the first embodiment, since one of the two Z-axis drive units 80 that has the shorter transfer time T is used to mount the electronic component E1 held by the pickup nozzle 56, the time required to mount the electronic component E1 is reduced.

Furthermore, in the method of mounting components according to the first embodiment, at the time of mounting of an electronic component E1 by one of the Z-axis drive units 80, if the next electronic component E1 to be placed is held by the pickup nozzle 56 at the driving position 300 of the other of the Z-axis drive units 80, the downward movement of the pickup nozzle 56 by the other of the Z-axis drive units 80 starts before the start of transfer of the rotary head 50. Thus, the pickup nozzle 56 at the driving position 300 of the other of the Z-axis drive units 80 is able to place the electronic component E1 sooner. This reduces the time required to mount the electronic component E1.

Second Embodiment

Next, a second embodiment is described with reference to FIG. 9.

A surface mounter 1 according to the second embodiment differs from the first embodiment in how the Z-axis drive unit 80 used for picking up of the electronic component E1 is set and how the Z-axis drive unit 80 used for mounting of the electronic component E1 is set.

A control unit 110 according to the second embodiment sets one of the Z-axis drive units 80 (the Z-axis drive unit 80 at the right side (the upstream side) in this embodiment) as a main unit and the other of the Z-axis drive units 80 (the Z-axis drive unit 80 at the left side (the downstream side) in this embodiment) as a sub-unit. The main unit is basically used to pick up and place electronic components E1. The sub-unit is used to pick up and place electronic components E1 only in the following case.

Figure 9:
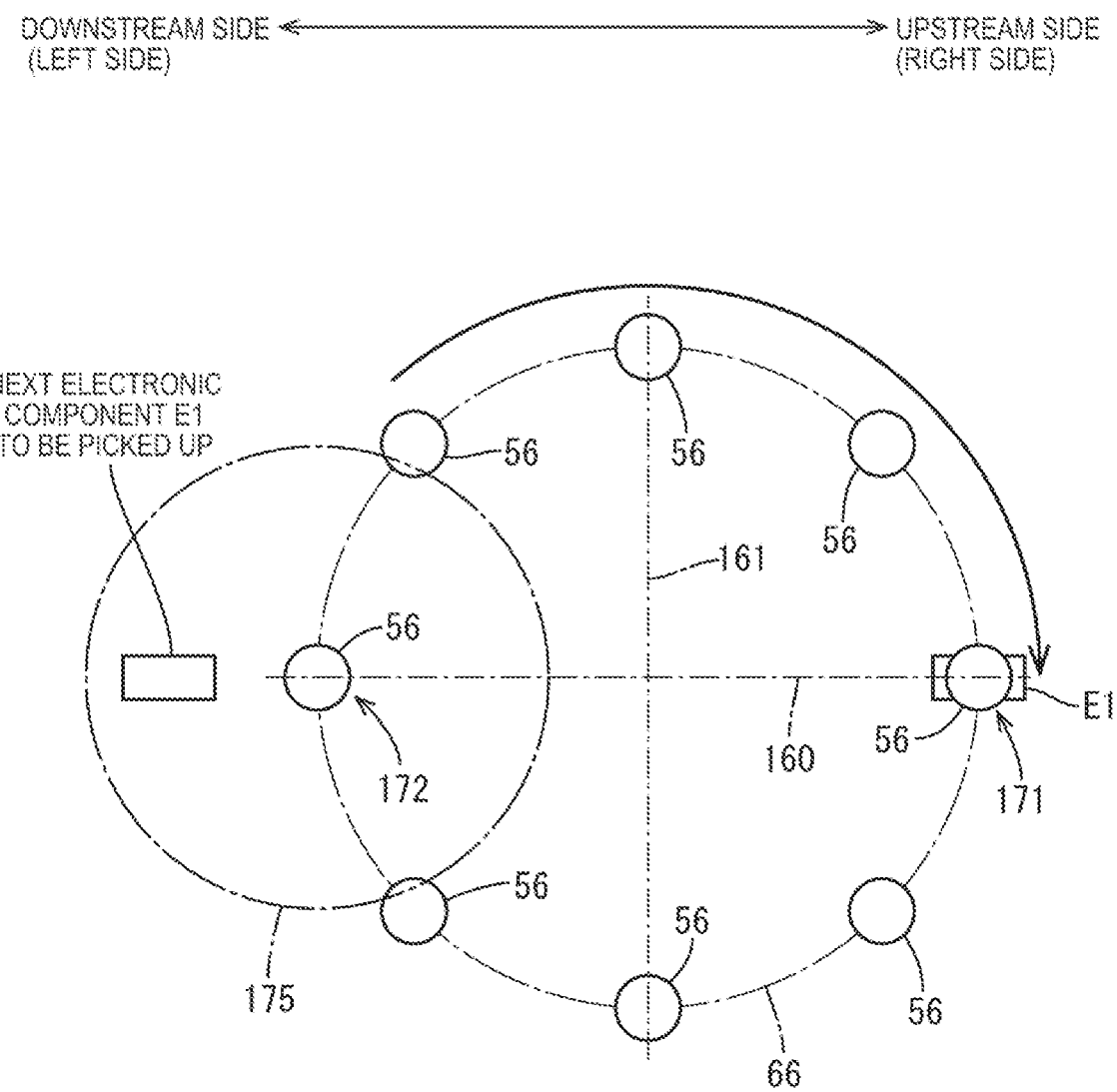
FIG. 9 is a schematic view for explaining setting of a component holding member drive unit used for picking up according to a second embodiment.

With reference to FIG. 9, the case where the sub-unit is used for picking up is described. In FIG. 9, only eight pickup nozzles 56 are illustrated for ease of understanding. In FIG. 9, a position 171 is a driving position 300 of the main unit and a position 172 is a driving position 300 of the sub-unit.

A circle 175 indicated by one-dot chain line is centered at the driving position 300 of the sub-unit. The radius of the circle 175 is smaller than the radius of the imaginary circle 66. In FIG. 9, a straight dotted line 160 is a first imaginary straight line connecting the driving position 300 of the main unit and the driving position 300 of the sub-unit. A straight dotted line 161 is a second imaginary straight line passing through the center of the first imaginary straight line 160 and extending perpendicular to the first imaginary line 160. As indicated in FIG. 9, the circle 175 is an area located away from the second imaginary straight line 161 toward the sub-unit. The circle 175 is one example of a predetermined area having the driving position 300 of the sub-unit therein.

When the next electronic component E1 to be picked up is picked up after one electronic component E1 is picked up, the component feeding position where the next electronic component E1 to be picked up is fed may be in the above-described circle 175, which is centered at the driving position 300 of the sub-unit, i.e., the component feeding position may be in the predetermined area having the driving position 300 of the sub-unit therein. In such a case, the control unit 110, which runs the optimization program 113A, sets the sub-unit to pick up the next electronic component E1.

Then, when the next electronic component E1 to be picked up is picked up after one electrode component E1 is picked up, the control unit 110, which runs the mounting program 113B, uses the sub-unit to pick up the next electronic component E1 if the sub-unit is set to pick up the electronic component E1, and uses the main unit to pick up the next electronic component E1 if the sub-unit is not set to pick up the next electronic component E1.

In a similar way, when the next electronic component E1 is placed after one electronic component E1 is placed, the mounting position of the next electronic component E1 to be placed may be in the circle 175, which is centered at the driving position 300 of the sub-unit. In such a case, the control unit 110, which runs the optimization program 113A, sets the sub-unit to place the electronic component E1.

Then, when the next electronic component E1 is placed after one electronic component E1 is placed, the control unit 110, which runs the mounting program 113B, uses the sub-unit to place the next electronic component E1 if the sub-unit is set to place the electronic component E1, and uses the main unit to place the next electronic component E1 if the sub-unit is not set to place the electronic component E1.

Furthermore, in the component mounting device 30 according to the second embodiment, the user is able to set the radius of the circle 175 (i.e., the predetermined area) at any value through the input portion 118.

The above-described method of mounting components according to the second embodiment only requires the calculation for determination whether the component feeding position where the next electronic component E1 to be picked up is fed is in the predetermined area having the driving position 300 of the sub-unit therein or not. The method does not require the calculation of the transfer time T for each of the Z-axis drive units 80. This reduces the time for the calculation required in setting of the Z-axis drive unit 80 used for picking up.

Furthermore, the method of mounting components according to the second embodiment only requires the calculation for determination whether the mounting position where the next electronic component E1 is to be placed is in the predetermined area having the driving position of the sub-unit therein or not. The method does not require the calculation of the transfer time T for each of the Z-axis drive units 80. This reduces the time required for the calculation in setting of the Z-axis drive unit 80 used for mounting of the electronic component E1.

Furthermore, in the method of mounting components according to the second embodiment, the predetermined area is a circular area centered at the driving position 300 of the sub-unit. Compared with the case where the predetermined area has a complicated shape, this makes it easier to determine whether the component feeding position where the next electronic component E1 to be picked up is fed is in the predetermined area having the driving position 300 of the sub-unit therein or not or this makes it easier to determine whether the mounting position of the next electronic component E1 to be placed is in the predetermined area having the driving position of the sub-unit therein or not. This reduces the time for the calculation required in setting of the Z-axis drive unit 80 used for picking up or mounting of the electronic component E1.

Furthermore, the method of mounting components according to the second embodiment enables the user to set the predetermined area. The method is more convenient for the user.

Although the circle 175 is used as one example of the predetermined area in this embodiment, the predetermined area is not limited to the circle area. The predetermined area may have any shape that defines a continuous area, not separated areas. The predetermined area may be an oblong shape or any other shapes. Alternatively, the entire area on the left of the second imaginary straight line 161 (side adjacent to the sub-unit) may be the predetermined area.

In the example of this embodiment, the user is able to set the predetermined area. The predetermined area may be defined as a distance travelled in a predetermined time. In the optimization calculation that determines the total mounting time using the optimization program 113A, the distance may be determined such that the total mounting time is shorter. For example, the predetermined area may have a rectangular shape extending in the X direction and the Y direction, not a circular shape. In such a case, the distances in the X direction and the Y direction travelled in a predetermined time by X axis driving and Y axis driving are determined using the optimization program 113A. The rectangular area defined by the determined distances may be the predetermined area.

Other Embodiments

The technology disclosed herein is not limited to the embodiments described above and illustrated by the drawings. For example, the following embodiments will be included in the technical scope of the present disclosure.

(1) In the example in the above-described embodiments, the control unit 110 included in the surface mounter 1 runs the optimization program 113A. However, an external computer may run the optimization program 113A and the memory 113 may store the control sequence generated by the optimization program 113A.

(2) In the example of the above-described embodiments, the pickup nozzle 56 is described as an example of a component holding member, but the component holding member is not limited to the pickup nozzle 56. For example, the component holding member may be a chuck type component holding member configured to hold the electronic component E1 with two claws.

(3) In the example of the above-described embodiment, the Z-axis drive unit 80 uses linear motor to move up and down the pickup nozzle 56. However, the Z-axis drive unit 80 may use a rotational motor to move up and down the pickup nozzle 56.

(4) The technology disclosed herein can be understood as an disclosure of a program (specifically, the optimization program 113A) that directs the component mounting device 30 to execute the method of mounting components described in the embodiments.

What is claimed is:

1. A surface mounter to mount components on a board comprising:
   a board transfer device configured to transfer the board in a first direction parallel to a plate surface of the board;
   a component supply device configured to feed components at the plurality of component feeding positions arranged in line in the first direction;
   a component mounting device configured to mount components fed at the plurality of component feeding positions arranged in one line onto a board at a mounting position, the component mounting device comprising:
      a rotary head movable in the first direction, the rotary head including:
         a rotary body;
         a rotary body drive portion configured to rotate the rotary body;
         a plurality of component holding members attached to the rotary body to be movable in a second direction parallel to a normal to the plate surface of the board along a rotation axis, the plurality of component holding members being circularly disposed about the rotation axis at predetermined intervals and configured to hold and release the components;
         a first holding member drive unit that moves one of the plurality of component holding members in the second direction at a first position at which the first holding member driver unit is adjacent to a first section of an edge of the rotary body;
         a second holding member drive unit being separated from the first holding member in the first direction to sandwich the rotary body between the first holding member drive unit and the second holding member drive unit, wherein the second holding member drive unit moves another one of the plurality of component holding members in the second direction at a second driving position separated from the first driving position in the first direction and at which the second holding member driver unit is adjacent to a second section of the edge of the rotary body opposite to the first section of the edge of the rotary body in the first direction; and
      a head transfer mechanism configured to move the rotary head in the first direction;
   a memory storing data; and
   a control unit configured to:
      control the rotary body drive portion and the head transfer mechanism to simultaneously perform rotation of the rotary body and transfer of the rotary head;
      determine a current position of the one of the plurality of component holding members to hold one of the components to be mounted next;
      determine a first rotary transfer time required for setting the one of the plurality of component holding members to hold the one of the component to be mounted next to a first driving position at which the one of the plurality of component holding members is to be moved in the direction along the rotation axis by the first holding member drive unit based on the data in the memory and the current position;
      determine a first driving position transfer time required for setting the first driving position to correspond with the one of the component feeding positions based on the data in the memory and the current position;
      determine a second rotary transfer time required for setting the one of the plurality of component holding members to a second driving position at which the one of the plurality of component holding members is to be moved in the direction along the rotation axis by the second holding member drive unit based on the data in the memory and the current position;
      determine a second driving position transfer time required for setting the second driving position to correspond with the one of the component supply positions based on the data in the memory and the current position;
      compare the first rotary transfer time with the first driving position transfer time;
      define one of the first rotary transfer time and the first driving position transfer time whichever is longer as a first transfer time;
      compare the second rotary transfer time with the second driving position transfer time;
      define one of the second rotary transfer time and the second driving position transfer time whichever is longer as a second transfer time;
      compare the first transfer time with the second transfer time;
      if the first transfer time is shorter than the second transfer time, control the first holding member drive unit to hold the one of the components with the one of the plurality of component holding members; and if the second transfer time is shorter than the first transfer time, control the second holding member drive unit to hold the one of the component with the one of the plurality of component holding members.

2. The surface mounter according to claim 1, wherein
the rotary head is configured to move in a movable range including at least a first end and a second end separated from each other in the arrangement direction of the component feeding positions, when the rotary head is located in the middle between the first end and the second end, a first driving position and a second driving position are located closer to the first end and the second end, respectively, wherein the first driving position is at which one of the component holding members is to be moved in the direction along the rotation axis by the first holding member drive unit and the second driving position is at which one of the component holding members is to be moved in the direction along the rotation axis by the second holding member drive unit, and the control unit is configured to:
move the rotary head within the movable range;
when the rotary head is at the first end of the movable range, control the first holding member drive unit to hold any of the components fed at any of the plurality of component feeding positions farther from the second end relative to the second driving position; and when the rotary head is at the second end of the movable range, control the second holding member drive unit to hold any of the components fed at any of the plurality of component feeding positions farther from the first end relative to the first driving position.

3. The surface mounter according to claim 1, wherein the control unit is configured to:

after control of the first holding member drive unit to hold one of the components with one of the component holding members is completed and before moving the rotary head, determine whether one of the component holding members to hold one of the components next is at a second driving position at which one of the component holding members is to be moved in the direction along the rotation axis by the second holding member drive unit and whether the second driving position corresponds with one of the component feeding positions at which the one of the components is to be fed next; and if the one of the component holding members is at the second driving position but the second driving position does not correspond with the one of the component feeding positions, control the second holding member control unit to move the one of the component holding members downward before moving the rotary head.

4. The surface mounter according to claim 1, wherein
the first holding member drive unit is a primary unit,
the second holding member drive unit is a secondary unit,
the control unit is configured to:
determine whether one of the component feeding positions at which one of the components to be held next is fed is in a predetermined area including a second driving position at which one of the component holding members is to be moved in the direction along the rotation axis by the second holding member drive unit, if the one of the component feeding positions is in the predetermined area, control the second holding member drive unit to hold the one of the components; and if not, control the first holding member drive unit to hold the one of the components.

5. The surface mounter according to claim 4, wherein the predetermined area is a circular area with the second driving position at a center.

6. The surface mounter according to claim 5, wherein
the component mounting device comprises a setting portion, and
the control unit is configured to receive settings of the predetermined area through the setting portion.

7. The surface mounter according to claim 4, wherein the predetermined area is a rectangular area including the second driving position.

8. The surface mounter according to claim 1, wherein the control unit is configured to:
after control of the first holding member drive unit to mount one of the components with one of the component holding members is completed and before moving the rotary head, determine whether another one of the components to be mounted next is held with one of the component holding members at a second driving position at which one of the component holding members is to be moved in the direction along the rotation axis by the second holding member drive unit;

if the other one of the components to be mounted next is held with the one of the component holding members at the second driving position, control the second holding member control unit to move the one of the component holding members downward before moving the rotary head.

9. The surface mounter according to claim 1, wherein
the first holding member driver unit is a primary unit;
the second holding member drive unit is a secondary unit;
the control unit is configured to:
determine whether one of mounting positions at which one of the components to be mounted next is in a predetermined area including a second driving position at which one of the component holding members is to be moved in the direction along the rotation axis by the second holding member drive unit, if the one of the mounting positions is within the predetermined area, control the second holding member drive unit to mount the one of the components; and if not, control the first holding member drive unit to mount the one of the components.

10. A surface mounter to mount components on a board comprising:
a board transfer device configured to transfer the board in a first direction parallel to a plate surface of the board;
a component supply device configured to feed components at the plurality of component feeding positions arranged in line in the first direction;
a component mounting device configured to mount components fed at the plurality of component feeding positions arranged in one line onto a board at a mounting position, the component mounting device comprising:
a rotary head movable in the first direction, the rotary head including:
a rotary body;
a rotary body drive portion configured to rotate the rotary body;

a plurality of component holding members attached to the rotary body to be movable in a second direction parallel to a normal to the plate surface of the board along a rotation axis, the plurality of component holding members being circularly disposed about the rotation axis at predetermined intervals and configured to hold and release the components;

a first holding member drive unit that moves one of the plurality of component holding members in the second direction at a first position at which the first holding member driver unit is adjacent to a first section of an edge of the rotary body;

a second holding member drive unit being separated from the first holding member in the first direction to sandwich the rotary body between the first holding member drive unit and the second holding member drive unit, wherein the second holding member drive unit moves another one of the plurality of component holding members in the second direction at a second driving position separated from the first driving position in the first direction and at which the second holding member driver unit is adjacent to a second section of the edge of the rotary body opposite to the first section of the edge of the rotary body in the first direction; and a head transfer mechanism configured to move the rotary head in the first direction;

a memory storing data; and a control unit configured to:

control the rotary body drive portion and the head transfer mechanism to simultaneously perform rotation of the rotary body and transfer of the rotary head;

determine a current position of the one of the plurality of component holding members holding one of the components to be mounted next;

determine a first rotary transfer time required for setting the one of the component holding members holding the one of the components to be mounted next to a first driving position at which one of the component holding members is to be moved in the direction along the rotation axis by the first holding member drive unit based on the data in the memory and the current position;

determine a first driving position transfer time required for setting the first driving position to correspond with one of mounting positions at which the one of the components to be mounted next is to be mounted based on the data in the memory and the current position;

determine a second rotary transfer time required for setting the one of the component holding members holding the one of the components to be mounted next to a second driving position at which one of the component holding members is to be moved in the direction along the rotation axis by the second holding member drive unit based on the data in the memory and the current position;

determine a second driving position transfer time required for setting the second driving position to correspond with one of mounting positions at which the one of the components to be mounted next to be mounted based on the data in the memory and the current position;

compare the first rotary transfer time with the first driving position transfer time;

define one of the first rotary transfer time and the first driving position transfer time whichever is longer as a first transfer time;

compare the second rotary transfer time with the second driving position transfer time;

define one of the second rotary transfer time and the second driving position transfer time whichever is longer as a second transfer time;

compare the first transfer time with the second transfer time;

if the first transfer time is shorter than the second transfer time, control the first holding member drive unit to mount the one of the components to be mounted next with the one of the component holding members holding the one of the components to be mounted next; and if the second transfer time is shorter than the first transfer time, control the second holding member drive unit to mount the one of the components to be mounted next with the one of the component holding members holding the one of the components to be mounted next.

* * * * *